(12) United States Patent
Ou et al.

(10) Patent No.: US 8,283,572 B2
(45) Date of Patent: Oct. 9, 2012

(54) PRINTED CIRCUIT BOARD

(75) Inventors: Guang-Feng Ou, Shenzhen (CN); Yong-Zhao Huang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 209 days.

(21) Appl. No.: 12/868,686

(22) Filed: Aug. 25, 2010

(65) Prior Publication Data

US 2012/0018210 A1    Jan. 26, 2012

(30) Foreign Application Priority Data

Jul. 20, 2010 (CN) .......................... 2010 1 0231585

(51) Int. Cl.
*H05K 1/11* (2006.01)
(52) U.S. Cl. ........................ 174/261; 174/254
(58) Field of Classification Search .......................... None
See application file for complete search history.

(56) References Cited

U.S. PATENT DOCUMENTS

| | | | |
|---|---|---|---|
| 7,239,527 B1 * | 7/2007 | Goergen | 361/788 |
| 7,609,125 B2 * | 10/2009 | van Quach et al. | 333/5 |
| 7,916,497 B2 * | 3/2011 | Yamaguchi | 361/778 |
| 2007/0091581 A1 * | 4/2007 | Gisin et al. | 361/782 |
| 2009/0086452 A1 * | 4/2009 | Liu et al. | 361/780 |

* cited by examiner

*Primary Examiner* — Yuriy Semenenko
(74) *Attorney, Agent, or Firm* — Altis Law Group, Inc.

(57) ABSTRACT

A printed circuit board includes a reference layer configured to connect to a power or a ground and a dielectric layer stacked on the reference layer. The dielectric layer includes a component surface opposing the reference layer. The component surface forms a differential pairs, a protection runner, and a power runner. The differential pairs include a substantially linear part. The protection runner is intervened between the linear part and the power runner, and is substantially parallel to the differential pairs. The length of the protection runner is approximately equal to that of the linear part. Each of the two ends of the protection runner forms a via that electrically connects the protection runner to the reference layer.

10 Claims, 6 Drawing Sheets

PRINTED CIRCUIT BOARD

BACKGROUND

1. Technical Field

The present disclosure relates to printed circuit boards routed with differential pairs, and particularly, to a printed circuit board having lower electronic crosstalk between the differential pairs and the power runner thereof.

2. Description of Related Art

A differential pair on a printed circuit board (PCB) is a pair of runners routed side by side, and used to carry high-speed differential signals. It is not uncommon that the differential pairs are required to be arranged parallel and adjacent to a power runner. In this case, electronic crosstalk between the differential pairs and the power runner is unavoidable and adversely affects the voltage stability of the power runner.

Therefore, it is desirable to provide a new printed circuit board which can overcome the above-mentioned shortcomings.

BRIEF DESCRIPTION OF THE DRAWINGS

Many aspects of the present disclosure should be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments of the present disclosure will now be described in detail with reference to the drawings.

Figure 1:
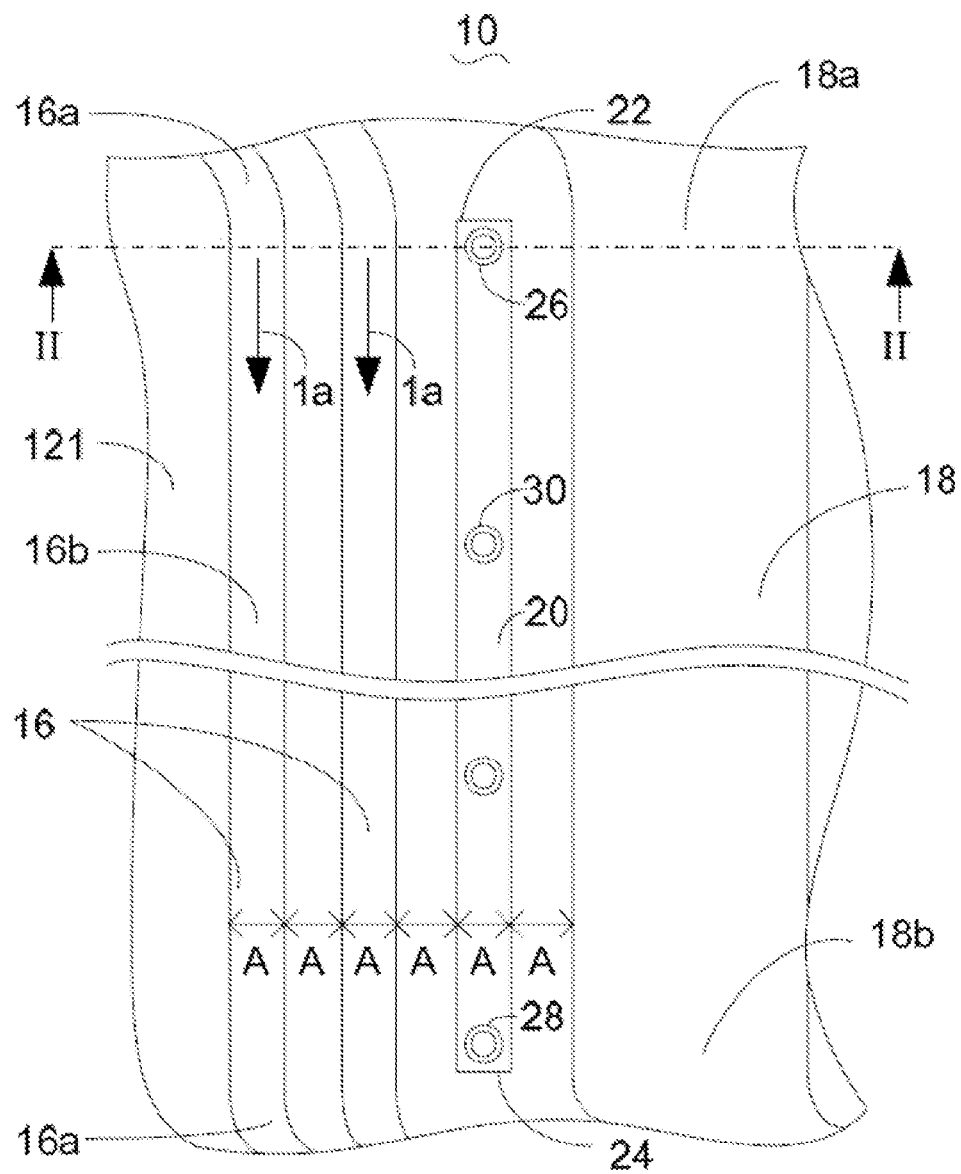
FIG. 1 is a planar view of a printed circuit board, according to an exemplary embodiment.
Figure 2:
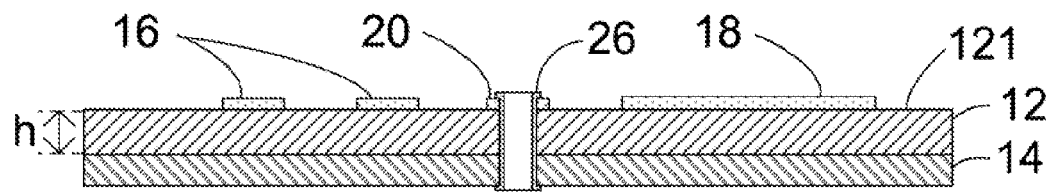
FIG. 2 is a cross-sectional view taken along the line II-II of FIG. 1.

Referring to FIGS. 1 to 2, a printed circuit board (PCB) 10, according to an exemplary embodiment, includes a reference layer 14 and a dielectric layer 12. The reference layer 14 stacks on the dielectric layer 12, and connects to a power or a ground (not shown). The dielectric layer 12 includes a component surface 121 opposing the reference layer 14. The component surface 121 is configured for routing runners. The component surface 121 forms a differential pairs 16, a protection runner 20, and a power runner 18. The protection runner 20 is intervened between the differential pairs 16 and the power runner 18. The differential pairs 16 include a substantially linear part 16b and two curved parts 16a connected to two ends of the linear part 16b. The protection runner 20 is substantially linear, and includes a start terminal 22 and an end terminal 24. The start terminal 22 and the end terminal 24 each form vias 26 and 28 respectively. The vias 26 and 28 electrically connect the protection runner 20 to the reference layer 14. The protection runner 20 is substantially parallel to the linear part 16b. The length of the protection runner 20 is approximately equal to that of the linear part 16b. The power runner 18 includes a first part 18a near the start terminal 22 and a second part 18b near the end terminal 24.

In the present embodiment, a differential signal flowing in the differential pairs 16 flows in a direction shown as the arrow 1a in FIG. 1. The frequency of the differential signal is about 200 MHz. The lengths of the linear part 16b of the differential pairs 16 and the protection runner 20 are both about 10 inches. The widths of the differential pairs 16 and the protection runner 20 are A. The pitch between the differential pairs 16 and the protection runner 20 is A. The distance between the power runner 18 and the protection runner 20 is also A. Herein, A is about 4 mils. The thickness "h" of the dielectric layer 12 is about 3 mils. Therefore, the distance between the differential pairs 16, the protection runner 20, the power runner 18 and the reference layer 14 is about 3 mils.

Figure 3:
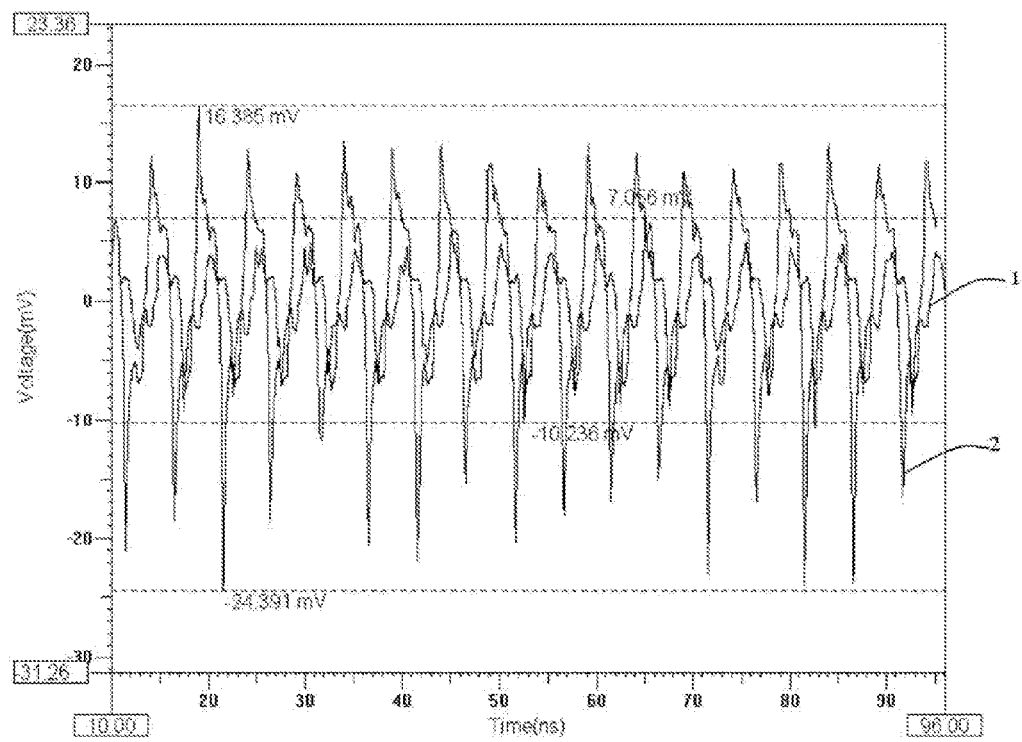
FIG. 3 is a drawing showing that the voltage of one end of a power runner varies with time when a protection runner connected to a ground is formed between a differential pairs and the power runner (shown as line 1), and that the voltage of the same end of the power runner varies with time without the protection runner formed between the differential pairs and the power runner (shown as line 2).

Referring to FIG. 3, when the reference layer 14 is connected to the ground, the protection runner 20 is also connected to the ground. In this condition, the voltage of the first part 18a of the power runner 18 that varies with respect to the time is shown as a curve 1 in FIG. 3. For comparison, a curve 2 illustrating the voltage varying with respect to the time without the protection runner 20 intervening between the differential pairs 16 and the protection runner 20 is shown in FIG. 3. As seen from FIG. 3, without the protection runner 20, the voltage at the first part 18a ranges from about −24.391 mV to about 16.385 mV. With the protection runner 20, the voltage at the first part 18a ranges from about −10.236 mV to about 7.056 mV.

Figure 4:
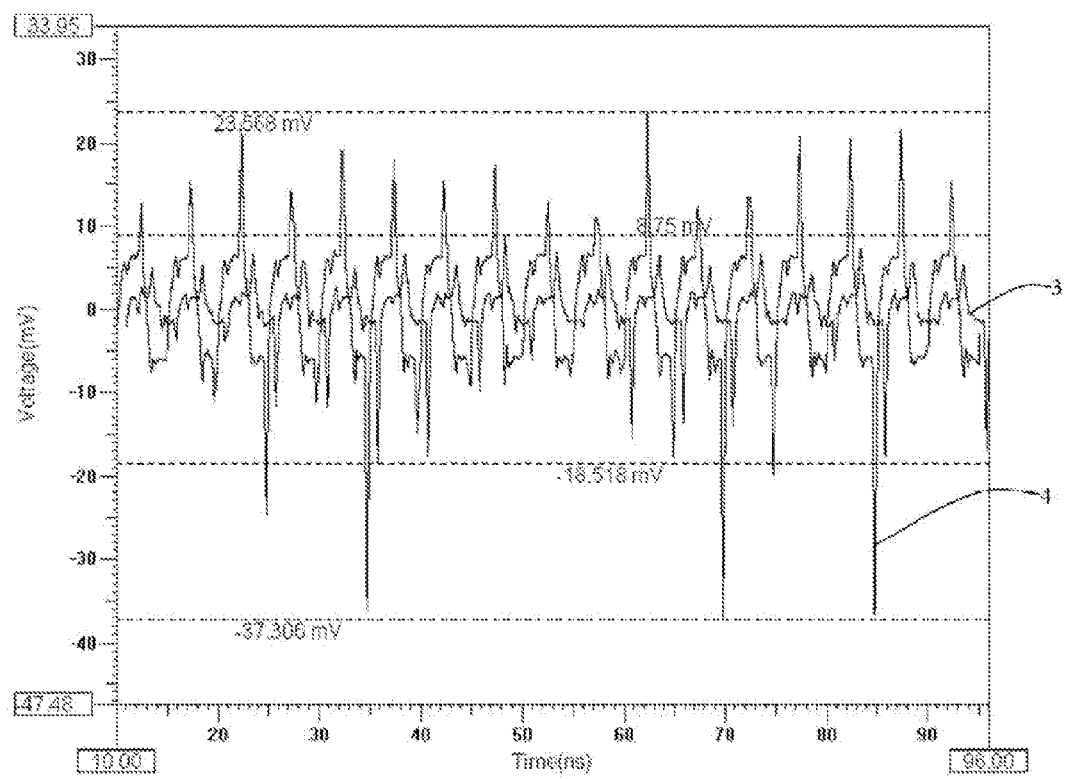
FIG. 4 is a drawing showing that the voltage of another end of the power runner varies with time when a protection runner connected to a ground is formed between the differential pairs and the power runner (shown as line 3), and that the voltage of the same end of the power runner varies with time without the protection runner formed between the differential pairs and the power runner (shown as line 4).

Referring to FIG. 4, when the reference layer 14 is connected to the ground, the voltage of the second part 18b of the power runner 18 varying with respect to the time is shown as a curve 3 in FIG. 4. Also the voltage of the second part 18b varying with respect to the time without the protection runner 20 is also shown as a curve 4 in FIG. 4. As seen from FIG. 4, without the protection runner 20, the voltage of the second part 18b ranges from about −37.306 mV to about 23.568 mV. With the protection runner 20, the voltage of the second part 18b ranges from about −18.518 mV to about 8.75 mV.

Figure 5:
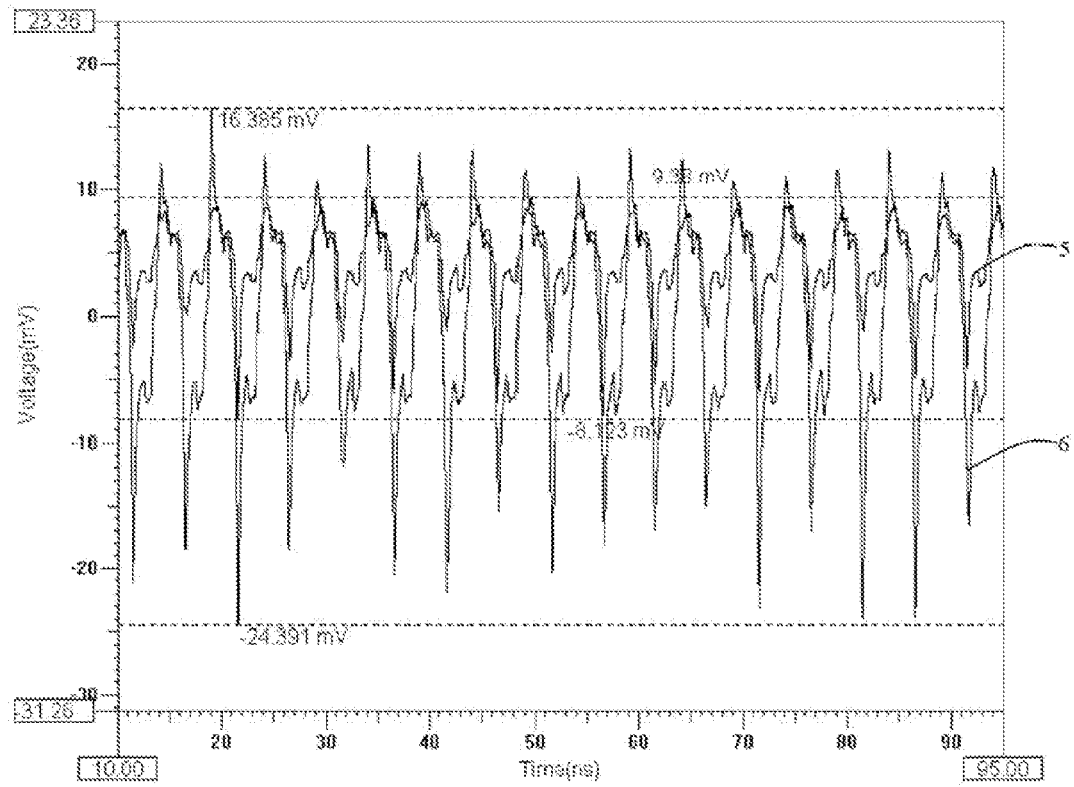
FIG. 5 is a drawing showing that the voltage of one end of a power runner varies with time when a protection runner connected to a power is formed between the differential pairs and the power runner (shown as line 5), and that the voltage of the same end of the power runner varies with time without the protection runner formed between the differential pairs and the power runner (shown as line 6).

Referring to FIG. 5, when the reference layer 14 is connected to a power of 3V, the voltage of the first part 18a varying with respect to the time is shown as a curve 5 in FIG. 5. The voltage of the first part 18a varying with respect to the time without the protection runner 20 is shown as a curve 6 in FIG. 5. As seen from FIG. 5, without the protection runner 20, the voltage of the first part 18a ranges from about −24.391 mV to about 16.385 mV. With the protection runner 20, the voltage of the first part 18a ranges from about −8.123 mV to about 9.38 mV.

Figure 6:
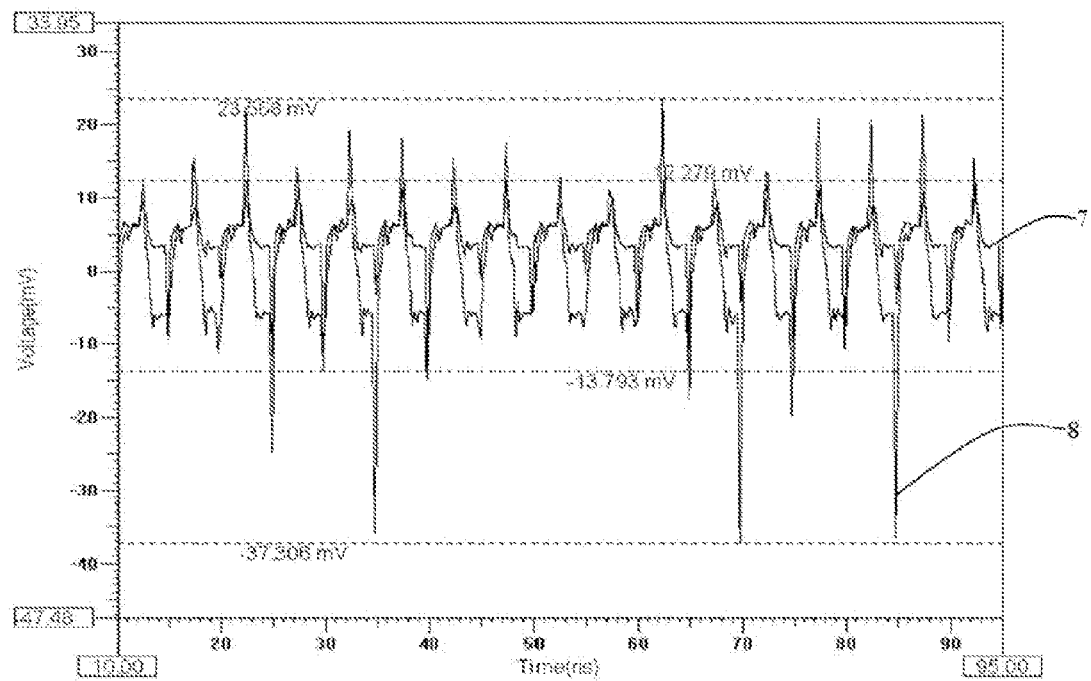
FIG. 6 is a drawing showing that the voltage of another end of the power runner varies with time when a protection runner connected to a power is formed between the differential pairs and the power runner (shown as line 7), and that the voltage of the same end of the power runner varies with time without the protection runner formed between the differential pairs and the power runner (shown as line 8).

Referring to FIG. 6, when the reference layer 14 is connected to a power of 3V, the voltage of the second part 18b varying with respect to the time is shown as a curve 7 in FIG. 6. The voltage of the second part 18b varying with the time without the protection runner 20 is shown as a curve 8 in FIG. 6. As seen from FIG. 6, without the protection runner 20, the voltage of the second part 18b ranges from about −37.306 mV to about 23.568 mV. With the protection runner 20, the voltage of the second part 18b ranges from about −13.379 mV to about 12.279 mV.

As seen from the above measurements, the voltage range at the protection runner 20 is reduced by about 50 percent by the protection runner 20 intervened between the differential pairs 16 and the protection runner 20. By doing measurements, it is proven that, for better shielding effectiveness, the width of the protection runner 20 should be at least about 4 mils. The interval between the differential pairs 16 and the protection runner 20 should be at least about 4 mils. The interval between the power runner 18 and the protection runner 20 should be at least also about 4 mils. The thickness of the dielectric layer 12 should be in the range from about 2.7 mils to about 4 mils.

In alternative embodiments, to reduce the antenna effect generated by the protection runner 20, a number of middle vias 30 which electrically connect the protection runner 20 to the reference layer 14 are formed on the protection runner 20. Each of the middle vias 30 is formed at the position that multiples via distances (S) from the via 26 (or via 28), wherein the via distance (S) is less than a twentieth of the wave length of the radiated wave having the highest frequency generated by the differential signal running through the differential pairs 16.

The highest frequency (f) of the radiated wave generated by the differential signal running through the differential pairs 16 can be calculated by the formula: f=0.35/tr. Wherein the "tr" represents the rise time of the differential signal flowing through the differential pairs 16, which usually could be gained from the specification of the chip that generates the differential signal. The speed (v) of radiated wave generated by the differential signal flowing through the differential pairs 16 can be calculated by the formula: $v=c/er^{1/2}$, wherein the "c" represents the speed of light, the "er" represents the dielectric constant of the differential pairs 16. According to the formula that wave length equals to speed divided by frequency, the via distance (S) can be described as: $S<(c*tr)/(7* er^{1/2})$.

It will be understood that the above particular embodiments is shown and described by way of illustration only. The principles and the features of the present disclosure may be employed in various and numerous embodiment thereof without departing from the scope of the disclosure as claimed. The above-described embodiments illustrate the scope of the disclosure but do not restrict the scope of the disclosure.

What is claimed is:

1. A printed circuit board, comprising:
   a reference layer configured to connect to a power or a ground; and
   a dielectric layer stacked on the reference layer, and comprising a component surface opposing the reference layer, the component surface forming a differential pairs, a protection runner, and a power runner,
   wherein the differential pairs comprises a substantially linear part, the protection runner is intervened between the linear part and the power runner, and substantially parallel to the differential pairs, the length of the protection runner is approximately equal to that of the linear part, each of the two ends of the protection runner forms a via that electrically connects the protection runner to the reference layer.

2. The printed circuit board of claim 1, wherein the width of the protection runner is not less than about 4 mils.

3. The printed circuit board of claim 1, wherein the width of the protection runner is about 4 mils.

4. The printed circuit board of claim 1, wherein the interval between the differential pairs and the protection runner is not less than about 4 mils, the interval between the power runner and the protection runner is not less than about 4 mils.

5. The printed circuit board of claim 1, wherein the interval between the differential pairs and the protection runner is about 4 mils, the interval between the power runner and the protection runner is about 4 mils.

6. The printed circuit board of claim 1, wherein a thickness of the dielectric layer ranges from about 2.7 mil to about 4 mil.

7. The printed circuit board of claim 1, wherein thickness of the dielectric layer is about 3 mils.

8. The printed circuit board of claim 1, wherein the protection runner forms a plurality of middle vias which electrically connect the protection runner to the reference layer at the position that multiples via distances from either vias formed at two ends of the protection runner, the via distance (S) complies with the following formula: $S<(c*tr)/(7*er^{1/2})$, the "c" represents the speed of light, the "tr" represents the rise time of the differential signal flowing through the differential pairs, the "er" represents the dielectric constant of the differential pairs.

9. A printed circuit board, comprising:
   a reference layer;
   a dielectric layer positioned on the reference layer, and comprising a component surface opposite to the reference layer;
   a differential pairs positioned on the component surface and comprising a substantially linear part;
   a power runner positioned on the component surface; and
   a protection runner positioned on the component surface between the linear part and the power runner, wherein the protection runner is substantially parallel to the linear part, two vias are positioned at two opposite ends of the protection runner and electrically connects the protection runner to the reference layer.

10. The printed circuit board of claim 9, wherein the length of the protection runner is about equal to that of the linear part.

* * * * *